(12) United States Patent
Cordes, Jr. et al.

(10) Patent No.: US 12,256,505 B2
(45) Date of Patent: Mar. 18, 2025

(54) ELECTRIFIED CONTAINER, RAILCAR, SHIP, CONNECTION PAD, AND/OR SEMI-TRAILER SYSTEM

(71) Applicants: James Francis Cordes, Jr., Drexel Hill, PA (US); Christopher P. Shuster, Drexel Hill, PA (US)

(72) Inventors: James Francis Cordes, Jr., Drexel Hill, PA (US); Christopher P. Shuster, Drexel Hill, PA (US)

(*) Notice: Subject to any disclaimer, the term of this patent is extended or adjusted under 35 U.S.C. 154(b) by 227 days.

(21) Appl. No.: 18/062,305

(22) Filed: Dec. 6, 2022

(65) Prior Publication Data

US 2023/0180406 A1 Jun. 8, 2023

Related U.S. Application Data

(60) Provisional application No. 63/265,008, filed on Dec. 6, 2021.

(51) Int. Cl.
| | |
|---|---|
| *H05K 5/02* | (2006.01) |
| *H02J 7/35* | (2006.01) |
| *H02S 10/20* | (2014.01) |
| *H02S 10/40* | (2014.01) |
| *H02S 40/22* | (2014.01) |

(52) U.S. Cl.
CPC .......... *H05K 5/0217* (2013.01); *H02J 7/35* (2013.01); *H02S 10/20* (2014.12); *H02S 10/40* (2014.12); *H02S 40/22* (2014.12); *H05K 5/0247* (2013.01)

(58) Field of Classification Search
None
See application file for complete search history.

(56) References Cited

U.S. PATENT DOCUMENTS

| | | | |
|---|---|---|---|
| 5,131,341 A | 7/1992 | Newman | |
| 6,380,481 B1 | 4/2002 | Muller | |
| (Continued) | | | |

FOREIGN PATENT DOCUMENTS

| | | | |
|---|---|---|---|
| JP | 2012001152 A | * | 1/2012 |
| KR | 20120014820 A | * | 2/2012 |

OTHER PUBLICATIONS

English machine translation of Kato (JP-2012001152-A) provided by the EPO website, all pages, 2024. (Year: 2024).*

(Continued)

*Primary Examiner* — Daniel P Malley, Jr.
(74) *Attorney, Agent, or Firm* — Dunlap Bennett & Ludwig, PLLC

(57) ABSTRACT

An electrified container assembly and system is herein disclosed. The assembly includes a container, a first photovoltaic sheet, a battery array, electrified corner castings, electrified twist-lock connectors, and a container controller. The container includes multiple walls. The first photovoltaic sheet is mounted to a first wall of container, and the first photovoltaic sheet generates electricity from sunlight. The battery array is mounted in the container and electrically coupled to the first photovoltaic sheet. Each electrified twist-lock connector is disposed in a respective electrified corner casting and is designed to transmit generated electricity, data, or both to an adjacent container or a connection pad. The container controller is used for controlling the first photovoltaic sheet, the battery array, and the plurality of electrified twist-lock connectors.

15 Claims, 9 Drawing Sheets

(56) References Cited

U.S. PATENT DOCUMENTS

| | | |
|---|---|---|
| 8,890,683 B2 | 11/2014 | Schnitz et al. |
| 9,157,418 B2 | 10/2015 | Petersen et al. |
| 10,246,166 B2 | 4/2019 | Kang et al. |
| 10,852,037 B2 | 12/2020 | Sant'Anselmo et al. |
| 11,440,814 B2 | 9/2022 | Johnson et al. |
| 2011/0247356 A1 | 10/2011 | Krosse et al. |
| 2011/0260470 A1 | 10/2011 | Ahmadi |
| 2011/0265319 A1 | 11/2011 | Meyers |
| 2013/0061902 A1 | 3/2013 | Quinn |
| 2013/0107555 A1 | 5/2013 | Quinn |
| 2018/0109163 A1* | 4/2018 | Paine ................. E04H 5/04 |
| 2021/0129873 A1 | 5/2021 | Cook |
| 2022/0069766 A1 | 3/2022 | Mullings |
| 2022/0074194 A1* | 3/2022 | Clark ................. E04H 1/12 |
| 2022/0224278 A1 | 7/2022 | Wright |
| 2023/0081734 A1* | 3/2023 | Prentice ............ H02S 20/32 |
| | | 136/245 |

OTHER PUBLICATIONS

English machine translation of Hoon (KR 20120014820 A) provided by the EPO website, all pages, 2024. (Year: 2024).*
English machine translation of Kato (JP-2012001152-A) provided by the EPO website, 2024, All Pages. (Year: 2024).*

* cited by examiner

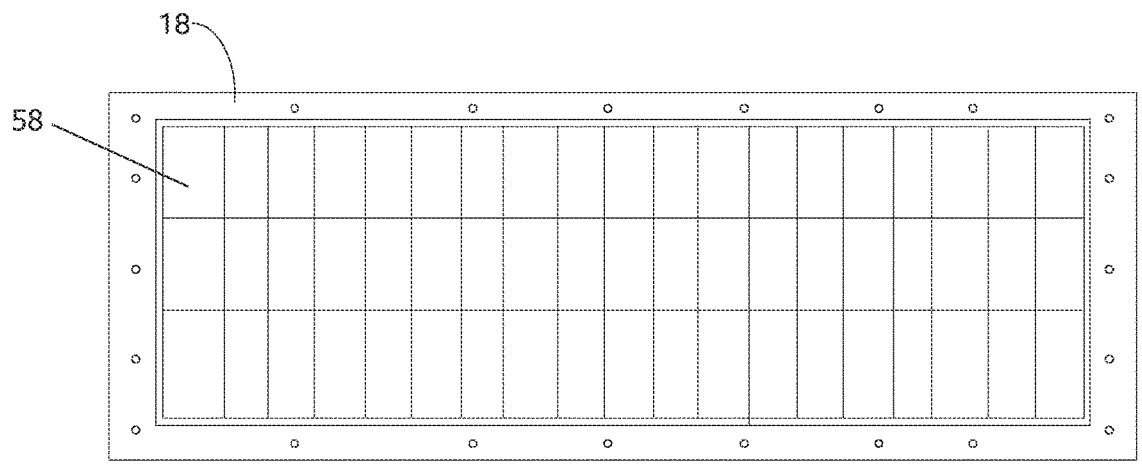
FIG. 2A
FIG. 2B
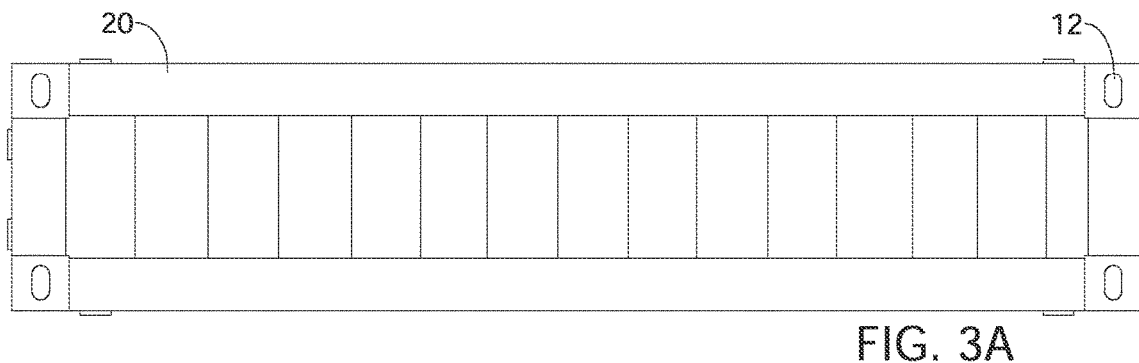
FIG. 3A
FIG. 3B

ELECTRIFIED CONTAINER, RAILCAR, SHIP, CONNECTION PAD, AND/OR SEMI-TRAILER SYSTEM

CROSS-REFERENCE TO RELATED APPLICATION

This application claims the benefit of priority of U.S. provisional application No. 63/265,008, filed Dec. 6, 2021, the contents of which are herein incorporated by reference.

BACKGROUND OF THE INVENTION

The present invention relates to freight transport and, more particularly, to an ecosystem of electrified containers, railcars, semi-trailers, ships, and connection pads for the collection, storage, and supply of electricity used during the transport of freight.

Moving freight requires the use of energy. In 2021, most of the energy used in this process is carbon-based and emits harmful carbon dioxide gas into the atmosphere. Existing systems have many issues. For example, they do not integrate the storage of power/electricity into the container that is being transported for the intended use of supplying the power needed to move the container itself. All existing systems move power from external sources into the freight transportation economy. None of the existing systems attempt to use the freight containers to generate power for the use of moving the freight.

Additionally, existing systems are not designed to make use of zero carbon energy sources, are not electrified, and are not integrated solutions. The transfer of electrical energy required to move freight using existing systems is slow enough to discourage the widespread use of them. There is no centralized data and reporting mechanism to understand the usage of power to move freight.

As can be seen, there is a need for an electrified ecosystem to dramatically reduce the need for carbon-based fuel to transport freight, as described herein.

SUMMARY OF THE INVENTION

In one aspect of the present invention, an electrified container assembly is provided that comprises: a container comprising a plurality of walls; a first photovoltaic sheet mounted to a first wall of the plurality of walls, the first photovoltaic sheet generating electricity from sunlight; a battery array mounted in the container and electrically coupled to the first photovoltaic sheet; a plurality of electrified corner castings; a plurality of electrified twist-lock connectors, each electrified twist-lock connector: (1) being disposed in a respective electrified corner casting and (2) configured to transmit generated electricity, data, or both to an adjacent container or a connection pad; and a container controller for controlling the first photovoltaic sheet, the battery array, and the plurality of electrified twist-lock connectors.

In another aspect of the present invention, an electrified system is provided that comprises: a transport vehicle comprising a connection pad; and an electrified container assembly comprising: a container comprising a plurality of walls; a first photovoltaic sheet mounted to a first wall of the plurality of walls, the first photovoltaic sheet generating electricity from sunlight; a battery array mounted in the container and electrically coupled to the first photovoltaic sheet; a plurality of electrified corner castings; a plurality of electrified twist-lock connectors, each electrified twist-lock connector: (1) being disposed in a respective electrified corner casting and (2) configured to transmit generated electricity, data, or both to the connection pad; and a container controller for controlling the first photovoltaic sheet, the battery array, and the plurality of electrified twist-lock connectors.

In another aspect of the present invention, an electrified system is provided that comprises: a first electrified container assembly comprising: a first container comprising a first plurality of walls; a first photovoltaic sheet mounted to a first wall of the first plurality of walls, the first photovoltaic sheet generating electricity from sunlight; a first battery array mounted in the first container and electrically coupled to the first photovoltaic sheet; a plurality of first electrified corner castings; a plurality of first electrified twist-lock connectors, each first electrified twist-lock connector: (1) being disposed in a respective first electrified corner casting and (2) configured to transmit generated electricity, data, or both to an adjacent container; and a first container controller for controlling the first photovoltaic sheet, the first battery array, and the plurality of first electrified twist-lock connectors; and a second electrified container assembly positioned adjacent the first electrified container and comprising: a second container comprising a second plurality of walls; a first photovoltaic sheet mounted to a first wall of the second plurality of walls, the second photovoltaic sheet generating electricity from sunlight; a second battery array mounted in the second container and electrically coupled to the second photovoltaic sheet; a plurality of second electrified corner castings; a plurality of second electrified twist-lock connectors, each second electrified twist-lock connector: (1) being disposed in a respective second electrified corner casting and (2) configured to transmit generated electricity, data, or both to the first container; and a second container controller for controlling the second photovoltaic sheet, the second battery array, and the plurality of second electrified twist-lock connectors.

As will become readily apparent from the following disclosure, the present invention includes a system that provides electrical power generation and electrical storage in freight container system, e.g., the International Standards Organization (ISO) 668 freight container ecosystem. As used herein, all references to ISO standards are with respect to the standards at the time of the filing date of the present invention. In certain embodiments, the system provides mobile, on-demand power. In certain embodiments, the system uses individual photovoltaic cells to facilitate resiliency of the photovoltaic array if any single or multiple cells become damaged. In certain embodiments, the system is used for physically transporting stored electrical energy from location to location. In certain embodiments, the system is used for arranging and storing battery cells in trays that are designed to fit into the floor joist bays of ISO 668 freight containers. In certain embodiments, the system makes use of miniature prismatic bars to redirect sunlight onto vertical photovoltaic cells for the effective and efficient gathering of solar energy. In certain embodiments, the system is used for the accounting for, and transfer of electrical energy between owners and/or users of the ISO 668 freight containers. In certain embodiments, the system is used for collecting, analyzing, and sharing metadata about the generation, collection, location, storage, usage, and transfer of electrical energy related to the photovoltaic cell arrays, battery storage, and transfer of electrical energy on and within ISO 668 freight containers. In certain embodiments, the system includes a process for retro-fitting existing ISO 668 freight containers to become electrified with photovoltaic cells, batteries, and associated hardware and electronics for the purpose of collecting solar energy, the storage of electrical energy, the electrical connection of, and transfer of electrical energy.

In accordance with the present invention, a system is provided for electrically connecting multiple ISO 668 freight containers at each of their four ISO 1161, Series 1 freight containers—Corning fittings/castings to allow the transfer of electrical power and data. Specifically, a mechanism is provided that allows for the safe connection of ISO 668 freight containers to facilitate the transfer of high-amperage, high voltage electrical power via four electrically-enabled ISO 1161 corner castings.

In accordance with the present invention, a system is provided for powering and motivating rail cars, tractor trailers, and container ships through the use of photovoltaic cladded, battery-enabled ISO 668 freight containers with electrically-enabled ISO 1161 Corner fittings. In certain embodiments, a system is provided for the electrical connection of photovoltaic cladded, battery-enabled ISO 668 freight containers to each other through the use of ISO/NP 3874, "Series 1 freight containers—Handling and securing", the ISO protocol for connecting ISO 668 freight containers together via the ISO 1161 corner castings. In certain embodiments, a system is provided for the connection of photovoltaic cladded, battery-enabled, ISO 668 freight containers to container ships, tractor trailers, railcars and stationary electrical connection pads through the use of ISO/NP Connection Protocol without additional steps or modification of existing processes.

These and other features, aspects and advantages of the present invention will become better understood with reference to the following drawings, description, and claims.

BRIEF DESCRIPTION OF THE DRAWINGS

The following figures are included to illustrate certain aspects of the present disclosure and should not be viewed as exclusive embodiments. The subject matter disclosed is capable of considerable modifications, alterations, combinations, and equivalents in form and function, without departing from the scope of this disclosure.

FIG. 2A is a top schematic view of the battery tray of FIG. 1;

FIG. 2B is a side schematic view of the battery tray of FIG. 2A;

FIG. 3A is a top schematic view of a solar pad of the present invention;

FIG. 3B is a side schematic view of the solar pad of FIG. 3A;

DETAILED DESCRIPTION OF THE INVENTION

Figure 1:
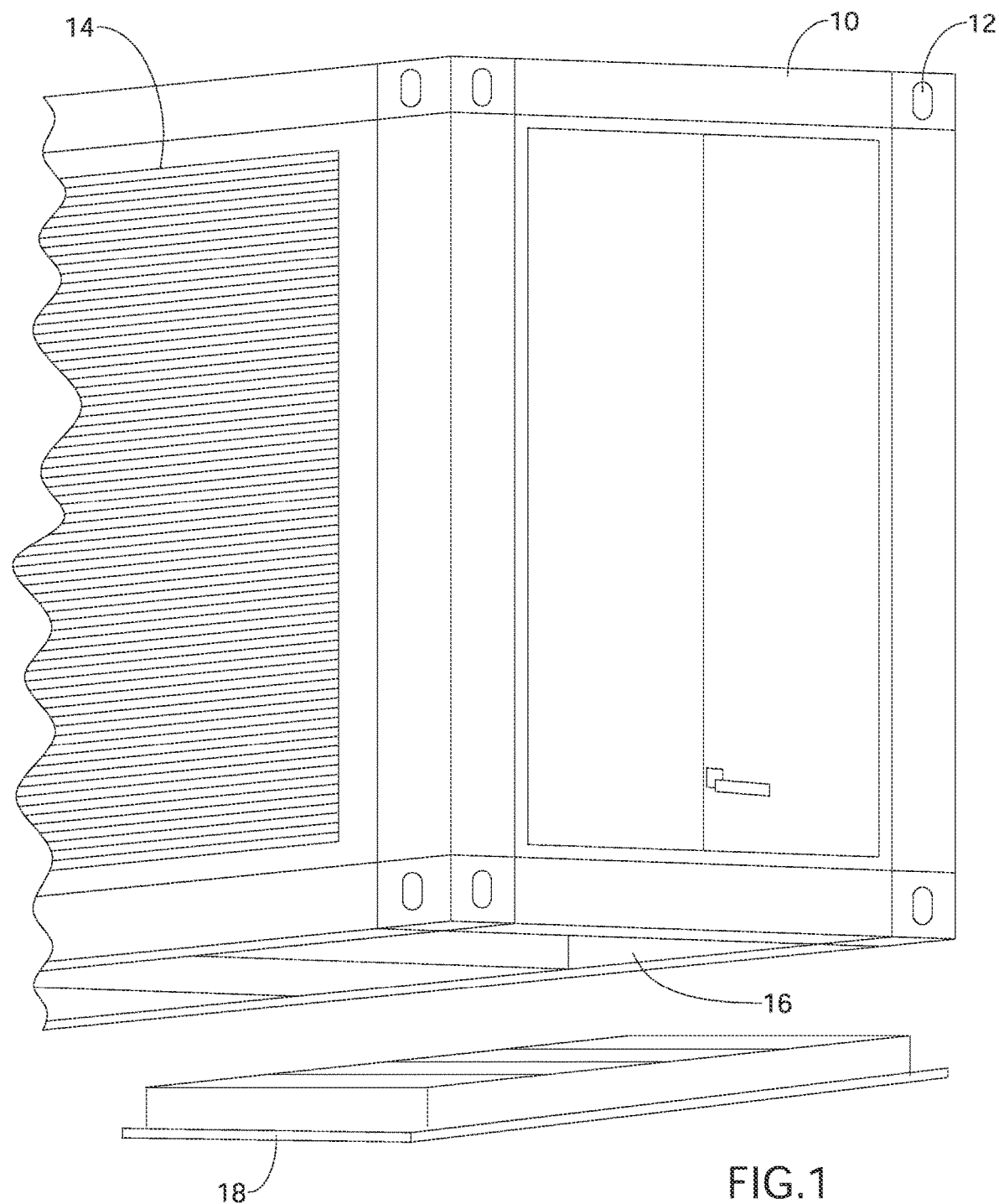
FIG. 1 is an exploded view of a battery tray and joist bays of the present invention.

The following detailed description is of the best currently contemplated modes of carrying out exemplary embodiments of the present invention. The description is not to be taken in a limiting sense but is made merely for the purpose of illustrating the general principles of the present invention, since the scope of the present invention is best defined by the appended claims.

Broadly, an embodiment of the present invention provides an ecosystem of electrified container(s), railcar(s), ship(s), connection pad(s), and/or semi-trailer(s).

The present invention provides a system (which, in certain embodiments, is an ecosystem) that allows containers to be linked by stacking and locked into place using electrified twist-lock connectors. Further, the system makes use of ambient sunlight to capture and store electricity within batteries contained in each container, for use in the transportation of the container(s), charging of other containers, and to provide electrical power where it may be needed. The ecosystem provides data logging and reporting on the linkage of the containers to each other, ships, railcars, trailers, and connection pads for the purpose of trading the energy contained in the containers and understanding how much energy the containers gather, store, and use. The ecosystem includes the electrification/motorization of railcars and semi-trailers that leverage the electricity stored in the containers for the use of moving the freight in the containers coupled (via the twist-lock connectors) to the ships, railcars, other containers and/or trailers. The present invention also includes wireless radio connections to and from the containers for the purpose of updating computer operating functions, transferring energy generation data and energy usage data to a distributed, cloud-computing data storage and reporting system that provides analytics, billing, and usage information.

Electrified containers in accordance with the present invention are a complete solution for harvesting, storing, and making use of electricity for the intended purpose of propelling the container during transport and providing electrical power to physical locations that may require remote power sources such as in emergency uses. The electrified corner couplings and electrified twist-lock connectors make possible the transfer of electricity to electrified/motorized trailers, ships, other containers and/or railcars. The present invention also makes use of data gathering and reporting to understand the impact of the electricity the containers are gathering and using while moving freight or delivering power to physical locations. Coupled with motivated/electrified ships, trailers, and/or railcars, the present invention uses readily available sunlight to generate electricity that can be used to motivate the freight during its transport journey or power facilities via NEMA connections, connection pads, or cranes that pick it up.

Because the present invention provides an integrated ecosystem, power is moved along with the freight in the most efficient manner possible. In certain embodiments, photovoltaic panels are mounted directly onto the containers being moved, and power is generated and stored in the container that needs to make use of it. Because the present invention specifies how containers couple simply and easily to trailers, railcars, ships and other containers, electricity is easily shared and used without complex or time-consuming and inefficient transferal processes.

Referring now to FIG. 1, an electrified shipping container 10 is shown. Each electrified container 10 is assigned a unique identifying number. The unique identifying number may be displayed on the exterior of the container 10 and may be stored permanently in the computer and software code (e.g., embodied as a program executable on the computer) integrated with the electrified container 10. The unique identifying number is used to signify all relevant data points related to the container 10, e.g., point of origin, owner, manufacturer, etc.

Figure 4A:
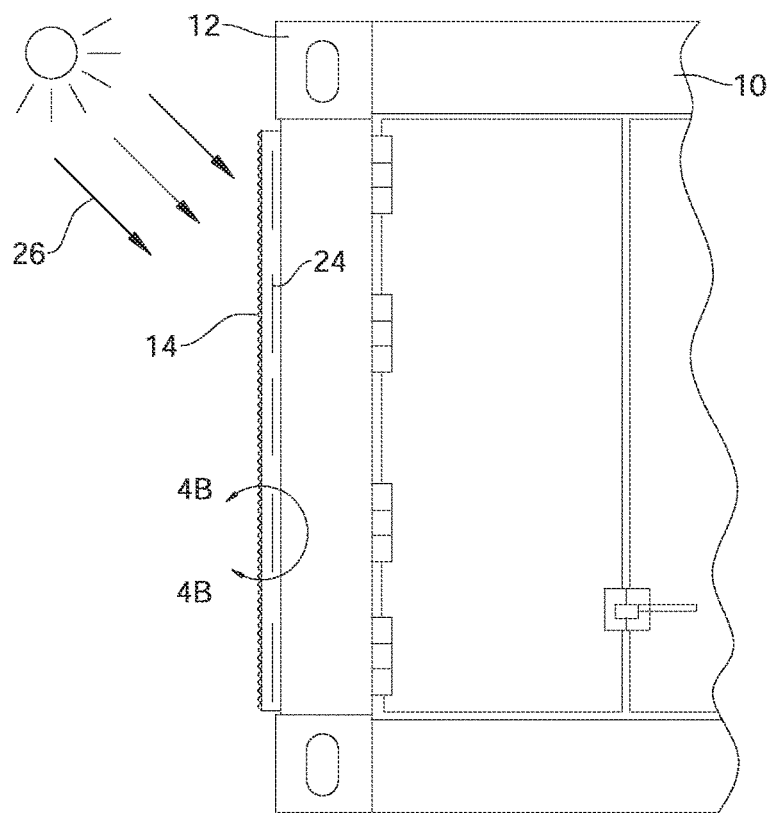
FIG. 4A is a schematic view of a prism panel and photovoltaic cell layout of the present invention.
Figure 4B:
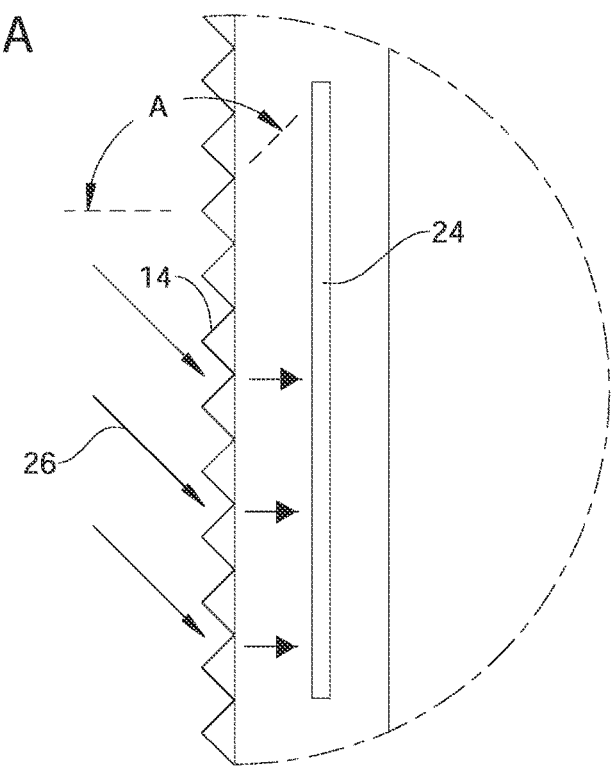
FIG. 4B is a detail schematic view of the layout of FIG. 4A.

Making reference to FIGS. 1 and 4A-4B, prism panels 14 (e.g., embodied as a Fresnel lens) are provided that are formed from thin rows of horizontal prisms stacked vertically (see FIG. 4B) on a sheet of flexible transparent material. This is fused to a photovoltaic thin film sheet 24 to form a sunlight collection system, where sunlight 26 shining onto the walls of the container 10 at 45-degrees (or thereabout) is redirected through the rows of prisms 14 to shine directly onto photovoltaic thin film sheets 24, as depicted in FIGS. 4A and 4B. Making reference to FIGS. 1, 4A, 10, 11, and 14, the photovoltaic thin film sheets 24 are mounted to the prism panels 14 and then are mounted onto the containers' outer walls and roof to occupy the majority of these surfaces.

Making reference to FIGS. 1-2B, electricity generated from sunlight 26 casting onto the sheets 24 is fed into a charge controller 58, which regulates power to charge a battery array 18. The battery array 18 is mounted into the subfloor 16 (e.g., joist bays) of the container 10 using battery mounting hardware (e.g., a mounting tray). The computer (which functions as a container controller) associated with the respective container and software code loaded on the computer monitors the battery array 18 and the charge controller 58 and logs it into its memory system. The computer may be mounted on the battery tray that retains the battery array 18 for ease of access and maintenance. For example, the following parameters are monitored and logged: electricity generated by the photovoltaic sheets 24, electricity transferred into the battery array 18, the unique identifying number(s) of any container 10 it is connected to, and transferring electricity to and or from, and the power used via a NEMA connection. A wireless network access device is used to make a computer data connection remotely to the container's computer to access logged data and to update the computer's software by using a cloud-based data repository. The cloud-based data repository makes all data available to authorized users of the repository based on permissions and roles assigned to each user.

Making reference to FIGS. 3A, 3B, 10 and 11, a connection pad 20 (also labeled as element 44 in FIG. 11 and element 52 in FIG. 12) is also provided. The connection pads 20 function as power adapters to transmit power and data from the containers 10 to any consumer/provider of electrical power that is not another electrified freight container 10. Connection pads 20 facilitate the connection of electrified freight containers 10 to electrical systems other than electrified freight containers (e.g., railcars, semi-trailers, ships, etc.). Connection of electrified freight containers to container ships, or other electrified equipment is facilitated through the use of connection protocol ISO/NP 3874. As shown in FIG. 3B, the connection pads 20 include corner castings 12 that engage corner castings 12 of an electrified container 10 (the corner castings 12 are discussed in greater detail below). Further, the pads 20 also include one or more outlets 22 to provide power to an standard electrical device, such as an extension cord.

Figure 5:
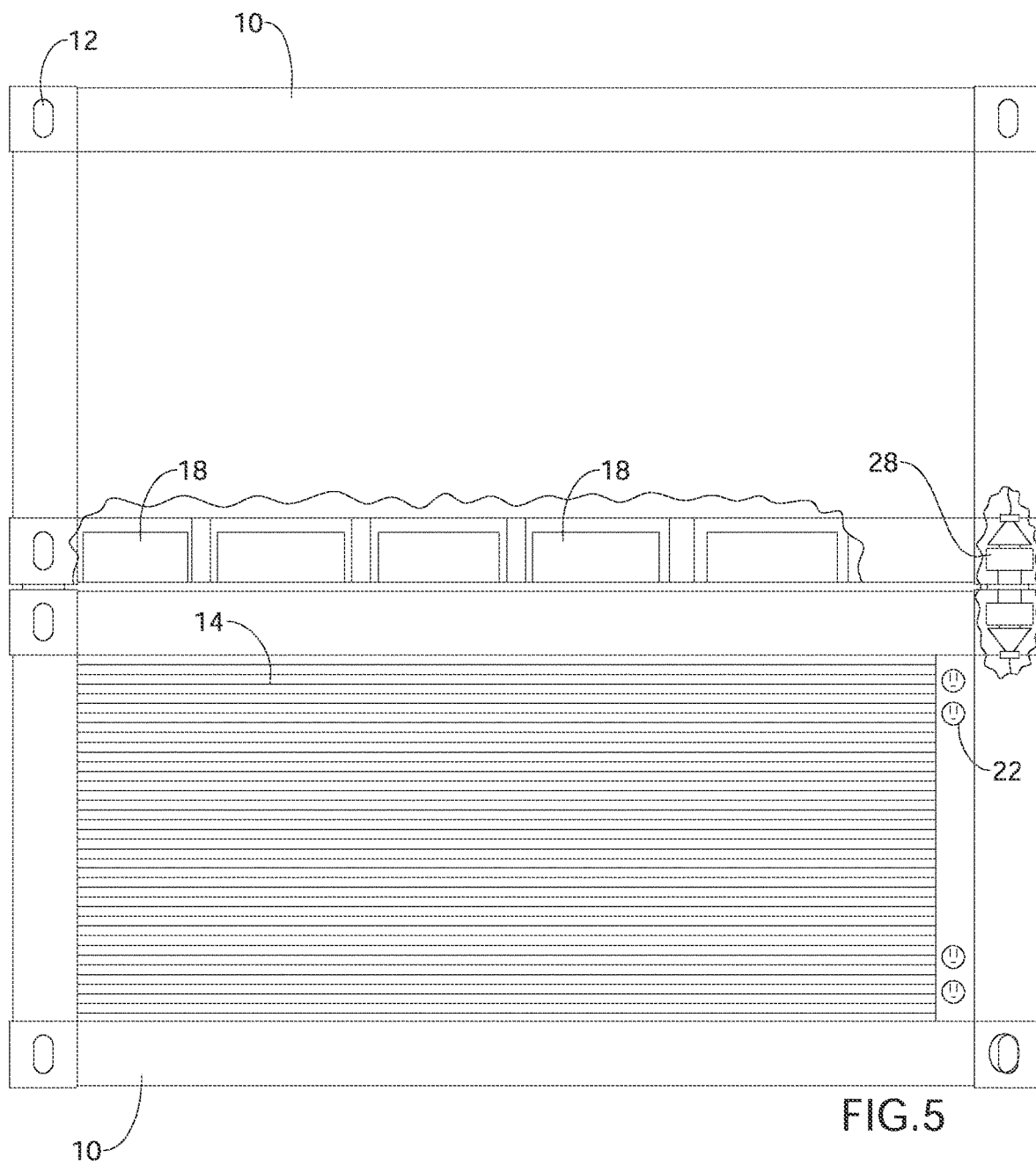
FIG. 5 is a schematic view of a plurality of battery trays provided within a container floor, similar to FIG. 1, and stacked with another container with electrical connection therebetween.
Figure 6:
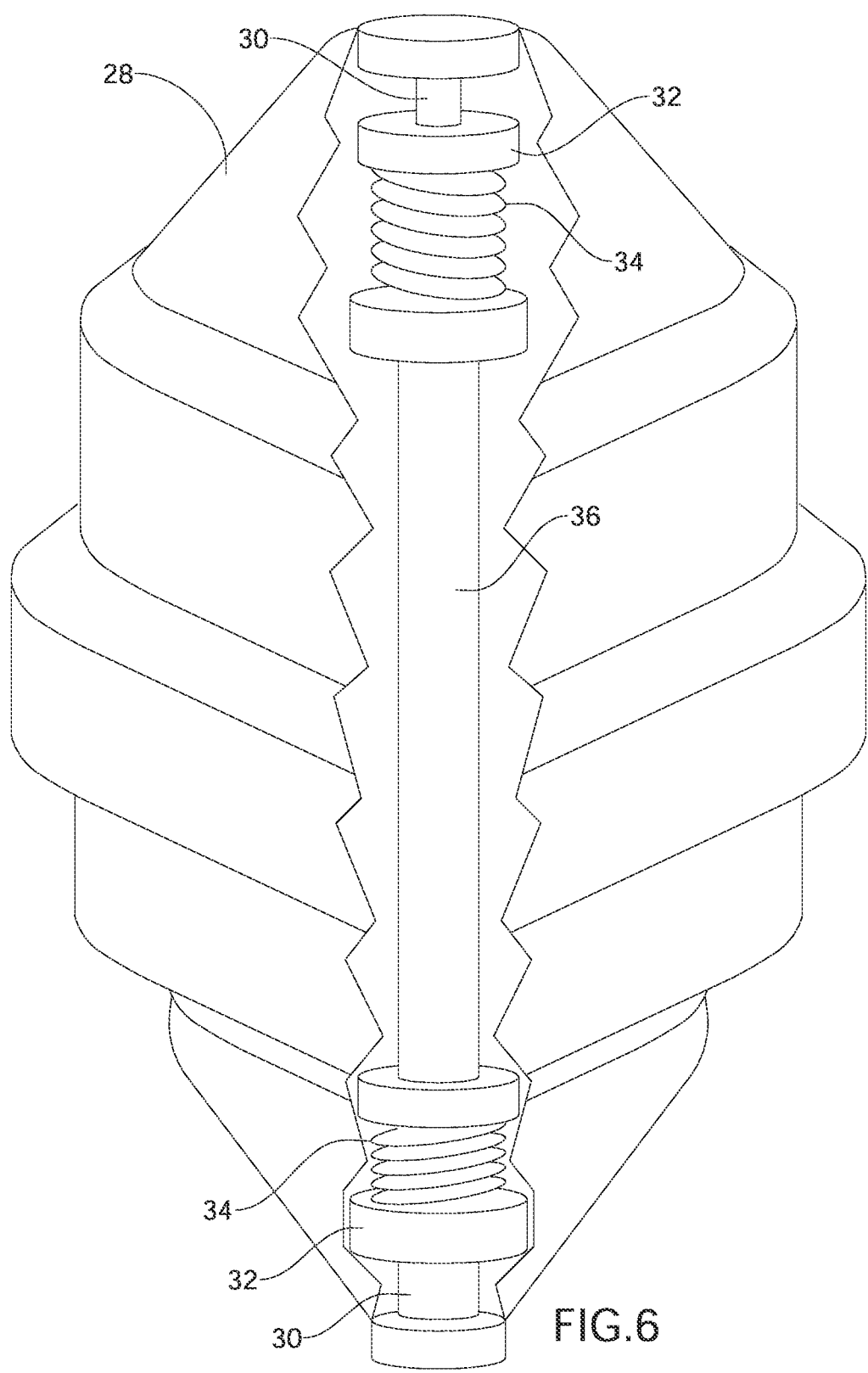
FIG. 6 is a cutaway view of a twist-lock connector of the present invention.
Figure 8:
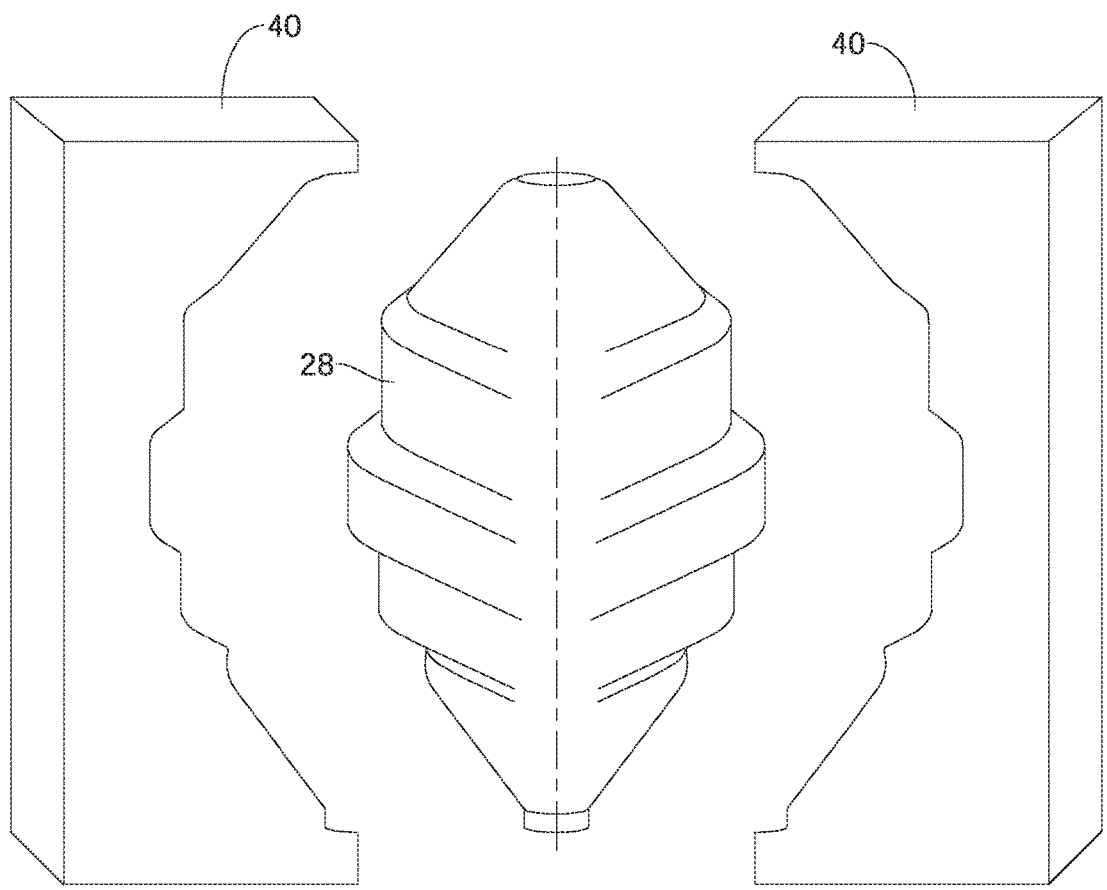
FIG. 8 is a schematic view of a twist-lock connector and die-cast mold.

Now turning to FIGS. 5 and 6, each electrified container 10 creates a link to another container 10, railcar (see FIG. 11), ship (see FIG. 12), connection pad 20, 44, 52 (see FIGS. 10-12), or semi-trailer 42 (see FIG. 1) by using an electrified twist-lock connector 28. As shown in FIG. 6, the twist-lock connector 28 includes rubber insulating tubes 30, a gold pad 32, spring 34, and core rod 36 (made from, for example, brass or copper). The rubber insulating tube 30 protects the conductor from interference from the coupler. The electrified twist-lock 28 is a semi-automatic invention in that it is used for both lashing connections and fully-automatic, above lashing linkages between containers 10 per the ISO 3874 standards for Handling and Securing. To functionally enable a container system to function in a manner consistent with the present disclosure, a standard ISO 3874 twist-lock connector is modified to facilitate the flow of a single current through a single conductor, which is isolated from the twist-lock and the corner casting. The use of a twist-lock connector 28 at each corner (see FIGS. 5 and 9) allows independent electrical connections, four on the top and four on the bottom of each freight container 10. The flow of electricity and data can be made from within each freight container 10 to a connected container or solar connection pad 20. See, for example, FIGS. 3, 6, and 8. The modified ISO 3874 twist-lock 28 may be cast in the die-cast mold as depicted in FIG. 8.

Figure 9:
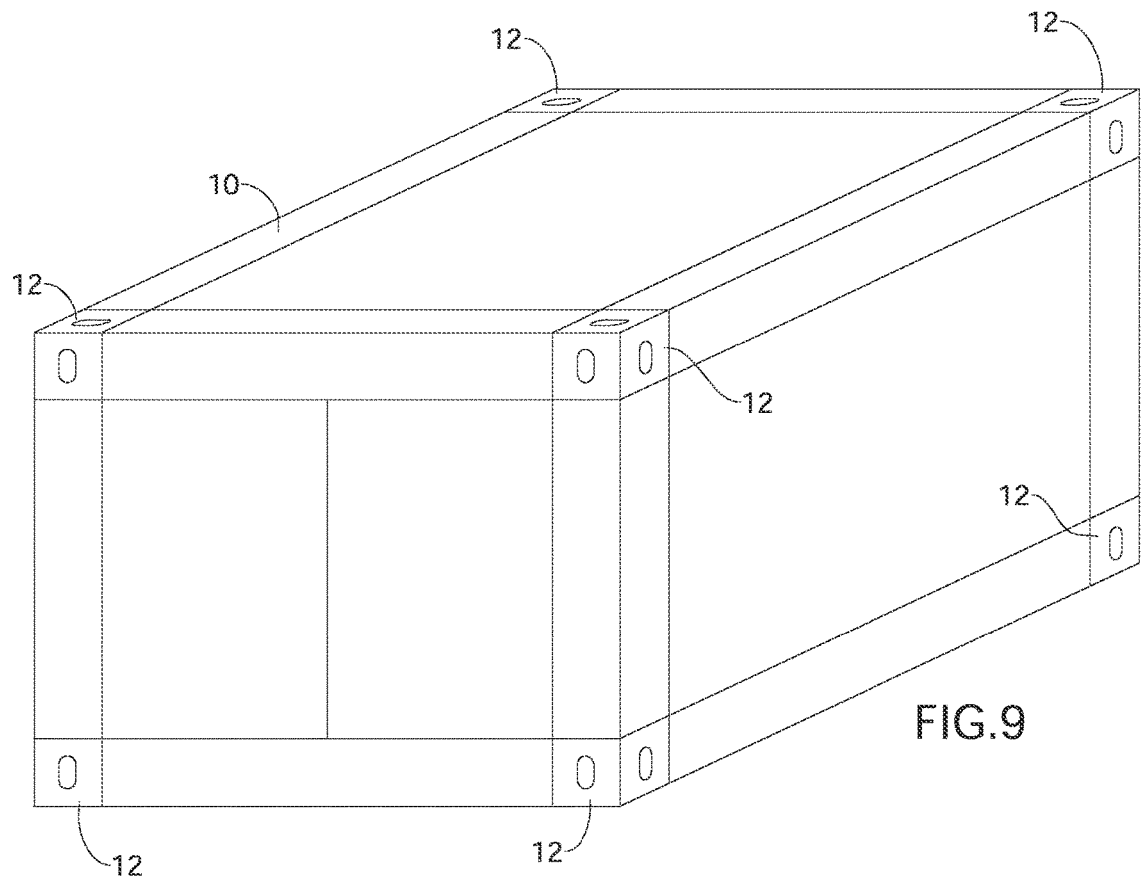
FIG. 9 is a schematic view of the data and electrical connections at the corners of a container.
Figure 13A:
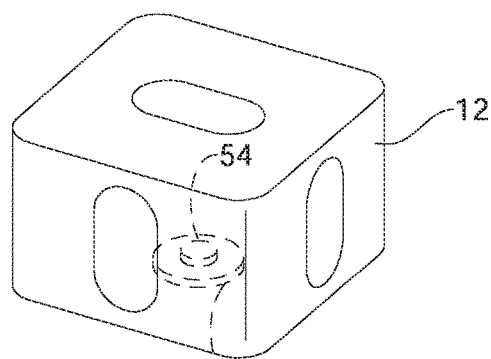
FIG. 13A is a top perspective view of the corner connection of the present invention.
Figure 13B:
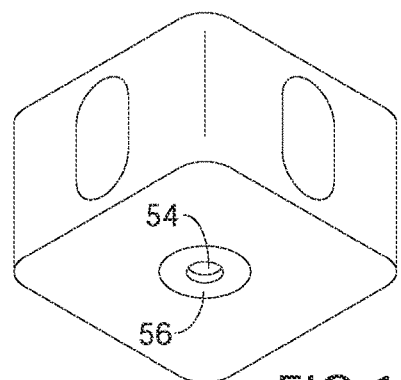
FIG. 13B is a bottom perspective view of the corner connection of FIG. 13A.

Once in place, the electrified twist-lock 28 makes contact with the container 10 above and the container 10, ship, semi-trailer 42, railcar, or connection pad 20, 44, 52 below it by extending a single-conductor that makes connection with an electrified ISO 1161 corner casting/coupling 12. As shown in FIGS. 13A and 13B, the corner casting 12 has a main body and further includes a grommet 56 and button 54. The grommet 56 is used for electrical isolation, while the button 54 is used as an electrical conductor, and may be embodied as a a flat corrosion-resistant material used to directly conduct electricity. Through the single conductor connection, data and electricity is permitted to flow. As shown in FIG. 9, the container 10, having four corners and four connections on the top and bottom (total of 8), is therefore able to make a data connection and a power connection with another container 10, ship, semi-trailer 42, railcar, or connection pad 20, 44, 52 below it.

As detailed above, and in use, the present invention employs a container 10 to house batteries 18, a computer, a charge controller 58, a wireless network access device, a unique identifying number, electrified corner castings 12, mounting hardware, and thin film photovoltaic sheets 24 to create a container 10 that can harvest, store, and supply electricity for use before, during, or after the freight transportation. The system makes use of sunlight 26 shining onto it to generate electricity via the thin film photovoltaic sheets 24 mounted on the container's exterior walls and roof. The electricity is routed to the charge controller 58, which regulates the flow of electricity into the battery array 18 which is mounted into the subfloor 16 of the container 10 via battery mounting hardware.

The computer and software code is linked to the battery array 18 for the purpose of monitoring each battery cell's health and status, such as charge level, number of charge cycles, available volts. The computer determines if the batteries 18 in the battery array 18 in the container 10 are full. If they are, electricity generated by the photovoltaic sheets 24 is allowed to pass to the container 10 electrically connected above or below it to charge its battery array 18. The computer is also linked to the charge controller 58 to log voltage generated by the photovoltaic sheets 24, electricity transferred to the batteries 18, and errors generated by the charge controller 58. The computer is also linked to the electrified corner castings/couplers 12 to monitor connections to the container 10. Based on the unique identifying number of the container 10 being coupled to it, the software of the computer is programmed to execute instructions that will grant access to transfer electricity to/from the container 10. The computer is also linked to the wireless network access device and regulates a data connection to the computer of the container 10 by other computers attempting to connect to the system.

Figure 10:
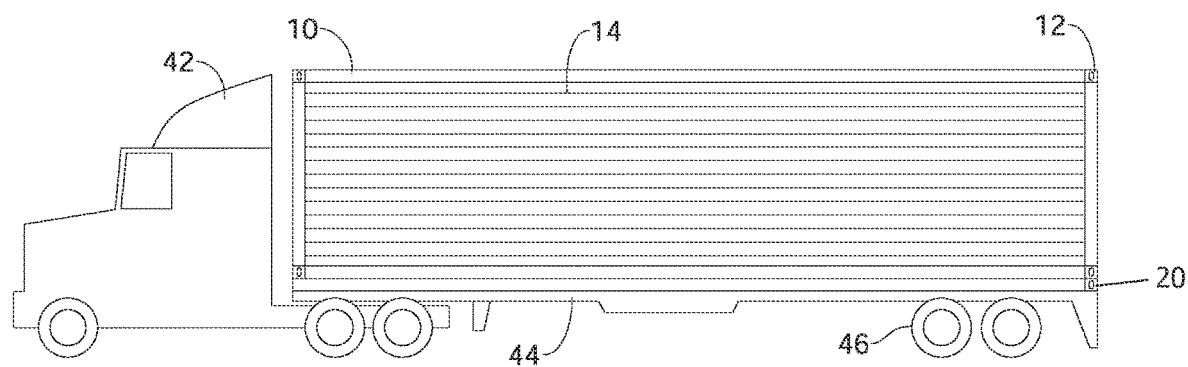
FIG. 10 is a schematic view of an electrified semi-trailer of the present invention.
Figure 11:
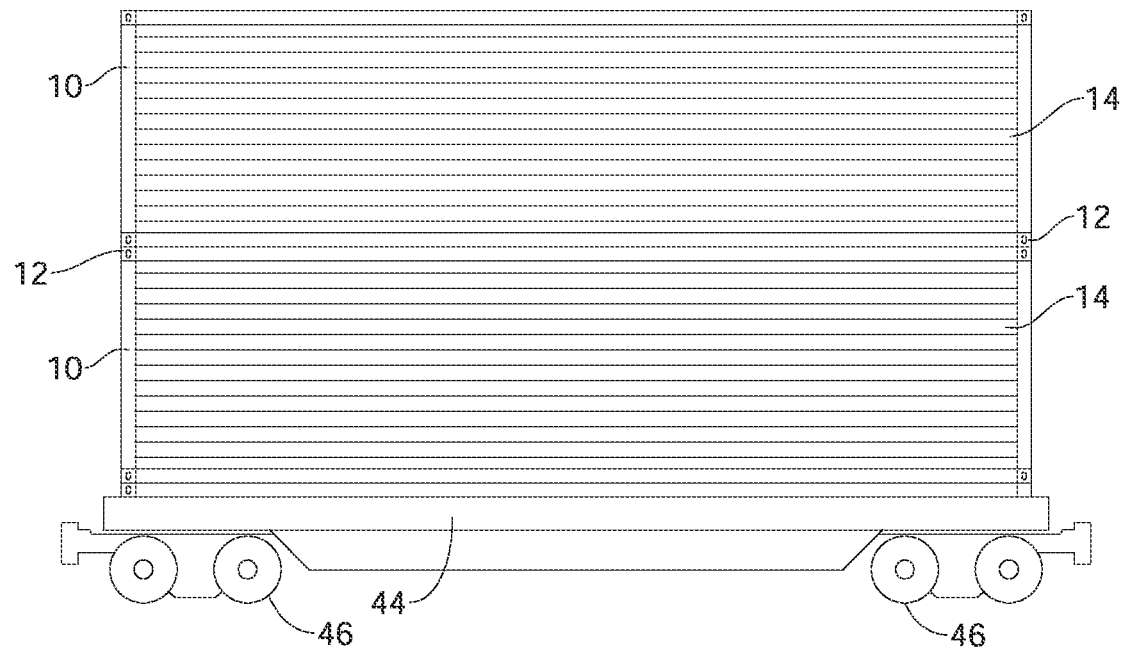
FIG. 11 is another schematic view of an electrified railcar of the present invention.
Figure 12:
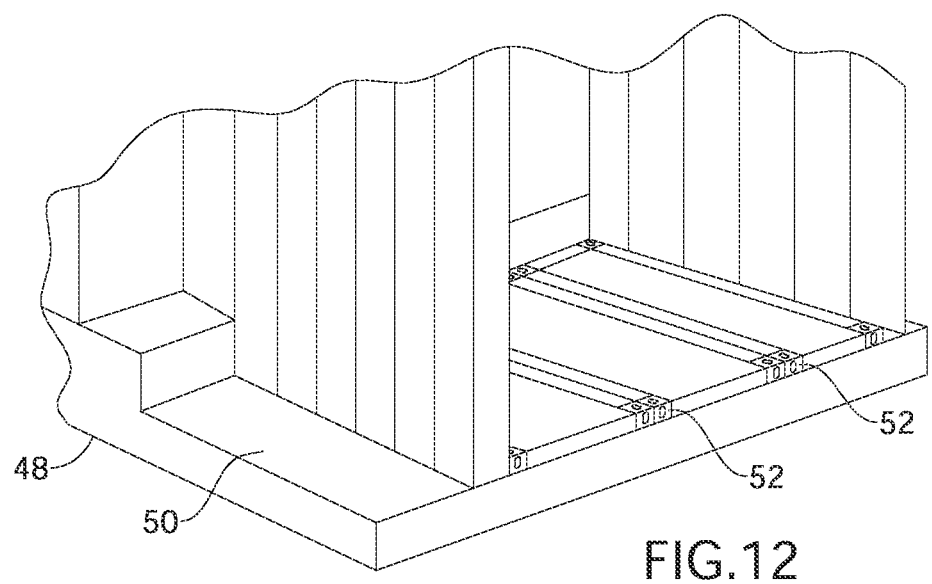
FIG. 12 is a detail view of a connection pad assembly for a container ship of the present invention.

As exemplified in FIGS. 10-12, when a container 10 is connected to an electrified railcar (FIG. 11), electrified semi-trailer 42 (FIG. 10), electrified ship (FIG. 12), or connection pad 20, 44, 52, the computer will verify that an electrical connection can be made. Using a verification method, such as a 5-volt verification method, to ensure a reliable connection at all four points of contact can be maintained, a high voltage connection and a data connection are initiated. When the container 10 is separated from another container 10, electrified railcar, electrified semi-trailer 42, connection pad 20, 44, 52, or ship, the electrical connection is terminated, and the event is logged into the computer's memory system for later synchronization with the cloud-based control system. Electricity generated, used, and transferred to and from each container 10 is logged by the computer(s) in each container 10 and periodically uploaded to the cloud-based data repository and control system for analysis and reporting. Referring specifically to FIG. 10, the computer can be used to start, stop and initiate regenerative braking operations of motors 46 on the semi-trailer. This can be enabled by sensors that are placed within the couplers that feed data into the computer(s) of the container 10.

The computer will use logic gates to grant authority based on the unique identifying number of connected containers 10, determine if cells within the photovoltaic sheets 24 are non-functional, determine charging levels for any specific battery in the battery array 18, grant authority via the wireless network access device, and grant authority to connected trailers 42, ships, and railcars requesting use of the electricity stored in the battery array 18.

As is readily apparent from the forgoing, the components of the present invention can be used in semi-trailers, in railcars, utility trailers, or any structure with walls and a roof that receive direct sunlight whether they are designed to move freight or not. For example, the same electricity capture and storage components described can be used to power refrigerated storage containers, heated containers, and any other device used to move any said freight-hauling containers.

In an exemplary embodiment, the electrified ecosystem may be used as follows. The various stakeholders in the global shipping industry (also referred to as "users") would use the present invention to harvest, store, and use energy to power the storage and transportation of global freight. Users would use the present invention to turn sunlight into a beneficial source of power to move freight without the need to use the various fossil fuels used across the shipping industry. Users could deploy the present invention to power storage facilities, semi-trailers, utility trailers, buses, or ships without the need to refuel and transfer power between transportation platforms. Users could leverage this ecosystem to motivate tractor trailers, railcars, and the ships themselves, as well as linking the ISO shipping containers with each other to increase the capture, storage, and distribution of solar power.

The present invention can be applied to utility trailers, freight trailers, and any freight-hauling container including semi-trailers, railcars, or utility trailers that receive direct sunlight before, during, or after its transport. The present invention can be applied directly to the exterior surfaces of freight ships, busses, vans, delivery vehicles, and railcars.

In accordance with the present invention, a process for cleaning the miniature prismatic bar sheets on the vertical sides of the ISO 668 freight containers is also provided. The process makes use of a gantry-type system similar to the retrofitting assembly (FIG. 14) described in this document. The process for cleaning the prismatic sheets resembles the brush assemblies use in commercial car washing systems.

An additional process is also included in the present invention for the repair and replacement of photovoltaic cells and the prismatic sheets. Repair and replacement processes facilitate the removal of the prismatic sheets and the damaged cells by trained workers following documented processes. The use of modular components facilitates rapid, error-free replacement of damaged cells without replacing entire photovoltaic arrays or panel assemblies.

In an exemplary embodiment, the system/ecosystem may be made/built out, as described above, and as follows. Building the present invention requires access to the components listed and a container 10 to mount them into and/or onto. The photovoltaic thin film panels 24 are mounted to the exterior walls and roof of the container 10 using, for example, a marine-grade adhesive that can be melted to allow the removal of panels that become damaged. The design intention behind the use of individual photovoltaic cells 24 is to minimize functional disruption in that damage to one individual cell will not disrupt the generating abilities of an entire grouping or array of cells. In contrast with conventional photovoltaic panels, damage to one cell 24 of the present invention will not interrupt the production for all the cells 24. Other coupling/adhering techniques, besides the marine grade adhesive, may be used, as appropriate. The twist-lock mechanism 28 may be formed, in part, using a die cast mold 40, as shown in FIG. 8.

Figure 7:
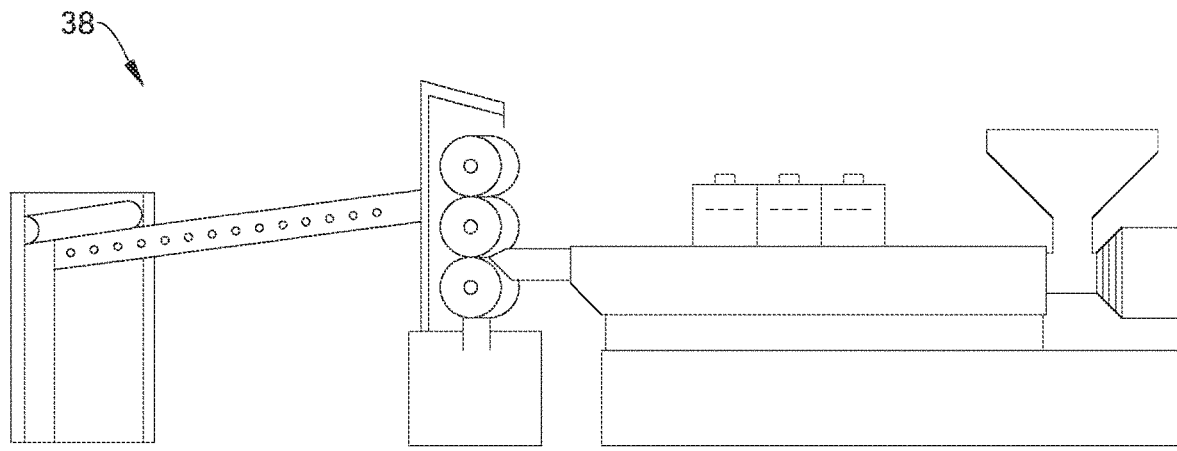
FIG. 7 is a schematic view of an exemplary lens extruding apparatus.

As shown in FIG. 7, an extruder 38 for producing the prism panels 14 is shown. This prismatic extruder 38 follows well-known processes for extrusion, but uses bulk transparent plastic material for the creation of optically suitable prisms.

The battery arrays 18 are composed of multiple battery cells that are placed into groups and using battery mounting hardware, secured into the subfloor 16 of the container 10, under the flooring, and between the bracing that creates the floor of the container. The computer, charge controller 58, and wireless network access device are also mounted in the subfloor 16 of the container 10 with the wireless network access device's antenna mounted on an external surface of one end of the container 10. The software code for the computer may be loaded into the computer 2 via a bootstrap process. The cloud-computing data warehouse and control system may be created by using a global public cloud service provider to host and replicate the data and control software.

Figure 14:
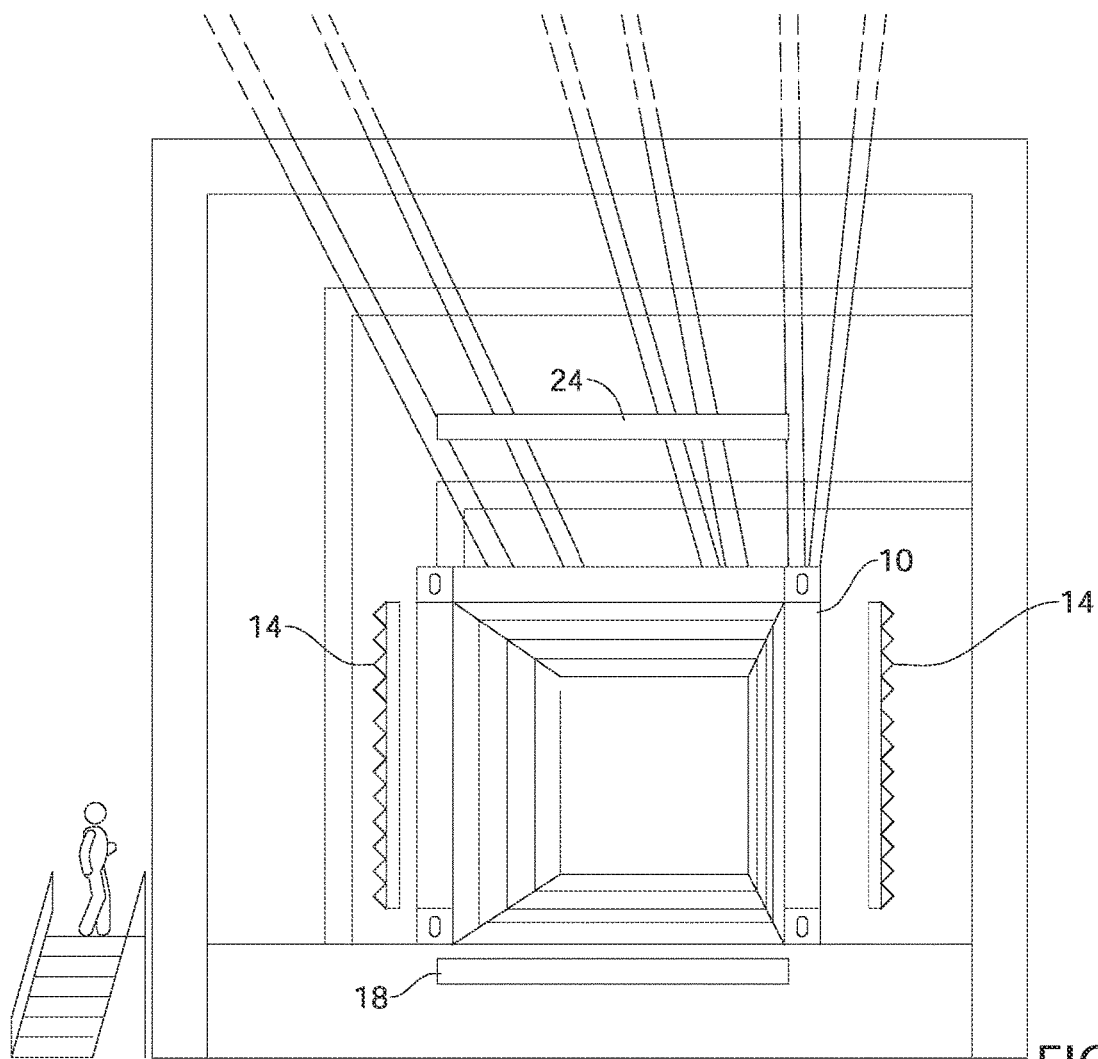
FIG. 14 is a schematic view of a retrofitting assembly device of the present invention.

As shown in FIG. 14, a process for retro-fitting existing ISO 668 freight containers to become electrified with photovoltaic cells, batteries, and associated hardware and electronics for the purpose of collecting solar energy, the storage of electrical energy, the electrical connection of, and transfer of electrical energy is shown. FIG. 14 depicts the gantry-type structure to retrofit existing ISO 668 freight containers with the corner castings 12, prism panels 14, photovoltaic cells 24, and battery array 18. Furthermore, FIG. 14 is conceived of a mobile or semi-permanent station. Using documented processes and trained professionals, the prism panels 14, cells 24, and battery array 18 can be attached, while the corner castings 12 require the removal of existing corner castings in favor of the novel ones discussed herein.

The present invention is dependent upon electrified ships, trailers, and railcars to make the system truly functional and beneficial. However, electrical power can be harvested and used by the containers at the beginning and end of their journeys as well to supply power to shipyards, factories, stores, warehouses, and countless other facilities. Linking the containers by stacking them allows entire cargo ships to arrive at port with fully charged containers ready to power trailers, railcars, and facilities.

The aspects of the present invention described above that incorporate a computer-based data processing system and method described above is for purposes of example only, and may be implemented in any type of computer system or programming or processing environment, or in a computer program, alone or in conjunction with hardware. The present invention may also be implemented in software stored on a computer-readable medium and executed as a computer program on a general purpose or special purpose computer. For clarity, only those aspects of the system germane to the invention are described, and product details well known in the art are omitted. For the same reason, the computer hardware is not described in further detail. It should thus be understood that the invention is not limited to any specific computer language, program, or computer. It is further contemplated that the present invention may be run on a stand-alone computer system or run from a server computer system that can be accessed by a plurality of client computer systems interconnected over an intranet network, or that is accessible to clients over the Internet. In addition, many embodiments of the present invention have application to a wide range of industries. To the extent the present application discloses a system, the method implemented by that system, as well as software stored on a computer-readable medium and executed as a computer program to perform the method on a general purpose or special purpose computer, are within the scope of the present invention. Further, to the extent the present application discloses a method, a system of apparatuses configured to implement the method are within the scope of the present invention.

The present invention has been described in terms of exemplary embodiments solely for the purpose of illustration. Persons skilled in the art will recognize from this description that the invention is not limited to the embodiments described but may be practiced with modifications and alterations limited only by the spirit and scope of the appended claims.

What is claimed is:

1. An electrified container assembly comprising:
   a container comprising a plurality of walls;
   a first photovoltaic sheet mounted to a first wall of the plurality of walls, the first photovoltaic sheet generating electricity from sunlight;
   a battery array mounted in the container and electrically coupled to the first photovoltaic sheet;
   a plurality of electrified corner castings;
   a plurality of electrified twist-lock connectors, each electrified twist-lock connector: (1) being disposed in a respective electrified corner casting of the plurality of electrified corner castings and (2) configured to transmit generated electricity, data, or both to an adjacent container or a connection pad; and
   a container controller for controlling the first photovoltaic sheet, the battery array, and the plurality of electrified twist-lock connectors.

2. The electrified container assembly of claim 1, wherein the container is an ISO 668 standard container.

3. The electrified container assembly of claim 1, wherein each electrified twist-lock connector comprises:
   an upper insulating tube at an upper distal end thereof;
   an upper pad proximal the upper insulating tube;
   an upper spring biasing the upper pad;
   a lower insulating tube at a lower distal end thereof;
   a lower pad proximal the lower insulating tube;
   a lower spring biasing the lower pad; and
   a connecting rod connecting the upper spring and the lower spring.

4. The electrified container assembly of claim 1, wherein each of the plurality of electrified corner castings comprises a grommet and a button.

5. The electrified container assembly of claim 1, wherein the battery array is mounted in a subfloor of the container.

6. The electrified container assembly of claim 1, further comprising a first prism panel coupled with the first photovoltaic sheet, the first prism panel redirecting sunlight to hit the first photovoltaic sheet.

7. An electrified system comprising:
   a transport vehicle comprising a connection pad; and
   an electrified container assembly comprising:
   a container comprising a plurality of walls;
   a first photovoltaic sheet mounted to a first wall of the plurality of walls, the first photovoltaic sheet generating electricity from sunlight;
   a battery array mounted in the container and electrically coupled to the first photovoltaic sheet;
   a plurality of electrified corner castings;
   a plurality of electrified twist-lock connectors, each electrified twist-lock connector: (1) being disposed in a respective electrified corner casting of the plurality of electrified corner castings and (2) configured to transmit generated electricity, data, or both to the connection pad; and
   a container controller for controlling the first photovoltaic sheet, the battery array, and the plurality of electrified twist-lock connectors.

8. The electrified system of claim 7, wherein each electrified twist-lock connector comprises:
   an upper insulating tube at an upper distal end thereof;
   an upper pad proximal the upper insulating tube;
   an upper spring biasing the upper pad;
   a lower insulating tube at a lower distal end thereof;
   a lower pad proximal the lower insulating tube;
   a lower spring biasing the lower pad; and
   a connecting rod connecting the upper spring and the lower spring.

9. The electrified system of claim 7, wherein each of the plurality of electrified corner castings comprises a grommet and a button.

10. The electrified system of claim 7, wherein the transport vehicle is a railcar.

11. The electrified system of claim 7, wherein the transport vehicle is a tractor trailer.

12. The electrified system of claim 7, wherein the transport vehicle is a ship.

13. An electrified system comprising:
- a first electrified container assembly comprising:
- a first container comprising a first plurality of walls;
- a first photovoltaic sheet mounted to a first wall of the first plurality of walls, the first photovoltaic sheet generating electricity from sunlight;
- a first battery array mounted in the first container and electrically coupled to the first photovoltaic sheet;
- a plurality of first electrified corner castings;
- a plurality of first electrified twist-lock connectors, each first electrified twist-lock connector: (1) being disposed in a respective first electrified corner casting of the plurality of first electrified corner castings and (2) configured to transmit generated electricity, data, or both to an adjacent container; and
- a first container controller for controlling the first photovoltaic sheet, the first battery array, and the plurality of first electrified twist-lock connectors; and
- a second electrified container assembly positioned adjacent the first electrified container and comprising:
- a second container comprising a second plurality of walls;
- a second photovoltaic sheet mounted to a first wall of the second plurality of walls, the second photovoltaic sheet generating electricity from sunlight;
- a second battery array mounted in the second container and electrically coupled to the second photovoltaic sheet;
- a plurality of second electrified corner castings;
- a plurality of second electrified twist-lock connectors, each second electrified twist-lock connector: (1) being disposed in a respective second electrified corner casting of the plurality of second electrified corner castings and (2) configured to transmit generated electricity, data, or both to the first container; and
- a second container controller for controlling the second photovoltaic sheet, the second battery array, and the plurality of second electrified twist-lock connectors.

14. The electrified system of claim 13, wherein each first electrified twist-lock connector and each second electrified twist-lock connector comprises:
- an upper insulating tube at an upper distal end thereof;
- an upper pad proximal the upper insulating tube;
- an upper spring biasing the upper pad;
- a lower insulating tube at a lower distal end thereof;
- a lower pad proximal the lower insulating tube;
- a lower spring biasing the lower pad; and
- a connecting rod connecting the upper spring and the lower spring.

15. The electrified system of claim 13, wherein each of the plurality of first electrified corner castings and each of the plurality of second electrified corner castings comprises a grommet and a button.

* * * * *